United States Patent
Biber (10) Patent No.: US 8,536,867 B2
(45) Date of Patent: Sep. 17, 2013

(54) MULTI-CHANNEL METHOD AND DEVICE TO EVALUATE MAGNETIC RESONANCE SIGNALS, WITH REDUCED NUMBER OF CHANNELS

(75) Inventor: Stephan Biber, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 537 days.

(21) Appl. No.: 12/718,254

(22) Filed: Mar. 5, 2010

(65) Prior Publication Data

US 2010/0225317 A1    Sep. 9, 2010

(30) Foreign Application Priority Data

Mar. 6, 2009  (DE) .......... 10 2009 012 109

(51) Int. Cl.
*G01V 3/00*    (2006.01)
*G01R 33/44*   (2006.01)

(52) U.S. Cl.
USPC ............ 324/309; 324/307; 324/318; 600/410

(58) Field of Classification Search
USPC .......... 324/300–322; 600/407–464
See application file for complete search history.

(56) References Cited

U.S. PATENT DOCUMENTS

| | | | |
|---|---|---|---|
| 6,801,035 B2 * | 10/2004 | Wang | 324/309 |
| 6,943,551 B2 | 9/2005 | Eberler et al. | |
| 7,098,659 B2 | 8/2006 | Reykowski et al. | |
| 7,196,629 B2 | 3/2007 | Ruoss et al. | |
| 7,505,803 B2 | 3/2009 | Boese et al. | |
| 2004/0193038 A1 * | 9/2004 | Reykowski et al. | 600/410 |
| 2006/0284812 A1 * | 12/2006 | Griswold et al. | 345/92 |
| 2008/0071169 A1 | 3/2008 | Craddock et al. | |
| 2008/0297152 A1 * | 12/2008 | Brau et al. | 324/309 |
| 2009/0115413 A1 * | 5/2009 | Senegas et al. | 324/309 |
| 2009/0192384 A1 | 7/2009 | Fontius | |
| 2009/0251144 A1 * | 10/2009 | Katscher et al. | 324/318 |
| 2009/0286478 A1 | 11/2009 | Biber et al. | |

FOREIGN PATENT DOCUMENTS

EP    2 040 336 A1    3/2009

* cited by examiner

*Primary Examiner* — Melissa Koval
*Assistant Examiner* — Emily Chan
(74) *Attorney, Agent, or Firm* — Schiff Hardin LLP (57) ABSTRACT

An optimized processing of data of multiple local coils is enabled by a device and a method to evaluate signals received with coils of a magnetic resonance tomography apparatus, wherein first signals are generated by means of coils via magnetic fields coming from a body, wherein a region in the body is defined, wherein weighting factors are calculated with the use of the first signals, wherein second signals are generated with the coils from magnetic fields coming from a body, wherein signals weighted with the use of the weighting factors are calculated from the second signals, wherein the weighted signals are processed further.

32 Claims, 10 Drawing Sheets

Matlab Code: Quick and Dirty Implementation

SIEMENS

Sample Matlab code

```
% Demo for Sotware MoMa
%load iSNR (iSNRs are the signals coming from the individual receive antennas for a low resolution image
acquired before the diagnostic scan)
SNRref=calc_snrsos(iSNR,eye(4,4),1); % calculate reference SNR with Sum of squares; assume no noise
x=120; y=180; % Optimize SNR for this pixel! (An automatic routine has to select these coordinates!)
ratio1=iSNR(x,y,2)./iSNR(x,y,1); % calculate weighting factor
k1=angle(ratio1)/pi;
s1=abs(ratio1)

ratio2=iSNR(x,y,4)./iSNR(x,y,3); % calculate weighting factor
k2=angle(ratio2)/pi;
s2=abs(ratio2)

comb1=[1*exp(j*pi*k1) s1]; % Combinationsvektor=Software=Modenmatrix
comb2=[s1*exp(j*pi*k1) 1 ]; % Combinationsvektor=Software=Modenmatrix % Apply weighting
signal1=comb1(1).*iSNR(:,:,1)+comb1(2).*iSNR(:,:,2);
noise1=sqrt(comb1*eye(2,2)*comb1');
iSNRnew(:,:,1)=signal1./noise1;
signal2=comb2(1).*iSNR(:,:,3)+comb2(2).*iSNR(:,:,4);
noise2=sqrt(comb2*eye(2,2)*comb2')
iSNRnew(:,:,2)=signal2./noise2;

% Display results
SNRnew=calc_snrsos(iSNRnew,eye(2,2),1);
figure(1);imagesc(rot90(abs(SNRnew)./abs(SNRref),0), [0.5 1]); colorbar; title(strcat('SNR ratio to SoS
:', num2str(abs(SNRnew(x,y))./abs(SNRref(x,y)))));
figure(2);imagesc(rot90(abs(SNRnew),0), [0 300]); colorbar; title(num2str(SNRnew(x,y)));
% Be Careful: The code does need additional modification for left/right
% focusing! Something is still buggy!
```

Page 7       July 2008         Stephan Biber,

For Internal use only / Copyright Siemens AG 2008.All rights reserved
Med MR PLM SC LC/Germany

SNR profile

Med MR PLM SC LC/Germany

MULTI-CHANNEL METHOD AND DEVICE TO EVALUATE MAGNETIC RESONANCE SIGNALS, WITH REDUCED NUMBER OF CHANNELS

BACKGROUND OF THE INVENTION

1. Field of the Invention

The present invention concerns multichannel methods and devices to evaluate signals received with coils of a magnetic resonance tomography apparatus.

2. Description of the Prior Art

A magnetic resonance apparatus to examine patients by magnetic resonance tomography is known from DE 10314215 B4, for example.

Modern magnetic resonance systems operate with coils to emit radio-frequency pulses for nuclear magnetic resonance excitation and/or to receive induced magnetic resonance signals. A magnetic resonance system (MRT or MR) typically has a larger coil (known as a whole-body coil, also called a body coil or BC) that is normally permanently installed in the apparatus, as well as multiple small local coils (also called surface coils or LCs). To read out information from which images can be generated, selected regions of the subject or patient to be examined are read out with gradient coils for three axes (for example X, Y approximately radial to the patient, Z in the longitudinal direction of the patient). The spatial coding in magnetic resonance tomography is typically achieved with the use of a gradient coil system with three independently controllable, magnetically orthogonal gradient field coils. The orientation of the coding plane ("gradient field") can be freely selected by superimposing the three freely scalable fields (in the three directions X, Y, Z).

As noted above, modern magnetic resonance systems normally operate with multiple different antennas (also called coils in the following) to emit radio-frequency pulses for nuclear magnetic resonance excitation and/or to receive the induced magnetic resonance signals. In contrast to the whole-body coil, the local coils serve to produce exposures with a very high signal-to-noise ratio (SNR). For this purpose the local coils are applied directly on the point (surface) of the patient at which the region to be examined is located. Given the use of such a local coil, in many cases transmission occurs with the whole-body coil (as the transmission coil) permanently installed in the magnetic resonance system and the induced magnetic resonance signals are received with the local coil (as reception coil).

In MR tomography today, images with high signal/noise ratio are normally acquired with such local coils (also called loops). The excited nuclei in the coil thereby induce a voltage that is then amplified with a low-noise preamplifier (LNA) that is relayed with its MR frequency to the receiver electronics via cable. Magnetic resonance scanners known as high field systems are also used to improve the signal-to-noise ratio (SNR) in high-resolution images. Their basic field strengths are presently 3 Tesla and higher. Since it should be possible to connect more coil elements (loops) to an MR receiver system than there are receivers present, a switching matrix (called an RCSS) is installed between the receiver antennas and the receivers (receiver circuits). This switching matrix routes the currently active received channels to the appropriate receiver. In order to be able to utilize the possibilities of parallel imaging (for example SENSE and GRAPPA, SMASH, etc.), reception coils with an increasingly higher number of channels are being developed.

It is conventional to use reception coils with 32-128 channels. The high number of reception channels places high demands on the reception chain. The high number of reception channels requires a high number of receivers (cost) and high computing effort in the image processing (computer time or costs for computing power). The use of the mode matrix is no longer reasonable from cost standpoints together with a frequency multiplexing method, since the mode matrix would have to be between the preamplifier and the mixer, which increases the configuration and costs of this module. Since the intermediate frequency receivers according to DE 10 2008 023 467 A1 are more advantageous than in the current product generation, the savings potential at the back end of the receiver chain (or RX chain)—for example in the form of an analog receiver—is markedly reduced while the use of the mode matrix together with the new intermediate frequency concept would turn out to be markedly more complicated technically and more expensive.

According to U.S. Pat. No. 7,098,659, a hardware mode matrix is known. This mode matrix combines adjacent receiver channels into combinations refined as modes. The mode matrix (MoMa) is a combination circuit composed of phase shifters and hybrids that combines the signals according to amplitude and phase so that N modes are obtained from N input signals from N coils. The first mode already contains the most important image information and offers the maximum SNR in the center of the patient. The use of higher modes offers increasing SNR in peripheral body regions and enables the application of parallel imaging techniques (for example SENSE or GRAPPA, SMASH etc.). Details regarding the mode matrix are described in U.S. Pat. No. 7,098,659, the disclosure of which is incorporated herein by reference. The mode matrix is used in modern products from the applicant in order to be able to operate the same coils with different receiver channel count.

An example of a previous solution is the following: 120 coil elements can be connected to an MR system. Although the switching matrix has 120 inputs and 32 outputs, only 8 receiver channels (receivers) are present. Solution: every 4 channels (for example) are combined into 4 modes by a mode matrix that is in the coil but lies after the preamplifier in the signal transmission direction. Therefore 8×4 modes are obtained from the 32 channels. If only the 8 basic modes (that are preferably the circularly polarized modes=CP modes) of these 8×4 modes are now read out, 8 reception channels suffice. This is the current prior art according to U.S. Pat. No. 7,098,659.

This technique allows a use of a higher-channel coil (=a coil with more channels provided) at a lower-channel receiver system (with limitations in the parallel imaging and given surface-proximal SNR). However, additional hardware is necessary for this in the coil. Therefore the aforementioned problem has not been solved in a satisfactory manner.

Moreover, such a hardware mode matrix entails the problem that, given mechanically flexible coils that can be deformed, the optimal SNR in the center of the patient body applies only for a deformed position of the coil (due to the relative position of the receiver loops to the reception field). In general, the combination of individual signals into modes is problematical if the antennas from which the signals arrive have no defined position relative to one another, or the antennas themselves can be deformed.

SUMMARY OF THE INVENTION

An object of the present invention is to efficiently optimize the evaluation of signals received with multiple coils in a magnetic resonance tomography apparatus.

The above object is achieved in accordance with the invention by a method to evaluate signals received with coils of a magnetic resonance tomography apparatus, wherein first signals are generated by the interaction coils with magnetic fields emanating from a defined body region of a subject, wherein weighting factors are calculated from the first signals, wherein second signals are generated by interaction of the coils with magnetic fields emanating from the defined body region, wherein signals weighted with the aid of the weighting factors are calculated from the second signals, and wherein the weighted signals are processed further.

The above object also is achieved in accordance with the present invention by a device that evaluates signals received by coils of a magnetic resonance tomography apparatus having a processor supplied with first signals acquired by interaction of coils with magnetic fields emanating from a defined body region of a subject, wherein the processor is configured to calculate weighting factors from the first signals, and wherein the processor is supplied with second signals generated by interaction of the coil with magnetic fields from the defined region of the body, and wherein the processor is configured to weight the second signals with the weighting factors in order to obtain weighted signals, and wherein the processor supplies the weighted signals to an output of the processor to an image computer for generating a magnetic resonance image.

The weighted signals can be obtained by multiplying the second signals with the respective weighting factors.

The first and second signals can be, for example, analog signals or (for example) digitized (DRX) signals (or data). For example, this can depend on whether they are considered before or after a digitization.

The invention enables a reduction in the number of channels without additional hardware expenditure (as well as without additional software). This channel reduction method is advantageously applied after the digitization (DRX) of the data. Instead of being fixed by hardware, weighting factors can be adaptively adjustable (for every patient and/or for every coil). Arbitrary reduction factors (count of the input channels versus count of the output channels) to reduce the number of signals to be taken into account for image processing in an image processing computer can be realized. The method can be applied to a wide variety of coil types.

The first signals can be for the acquisition of low-resolution MR image data, or a prescan measurement, or an adjustment measurement or for filling k-space lines that are not in or near the center of k-space.

The second signals (from which diagnostic images can be acquired for the physician) are advantageously of higher resolution than the first signals (from which the weighting factors are obtained).

DESCRIPTION OF THE PREFERRED EMBODIMENTS

Figure 1:
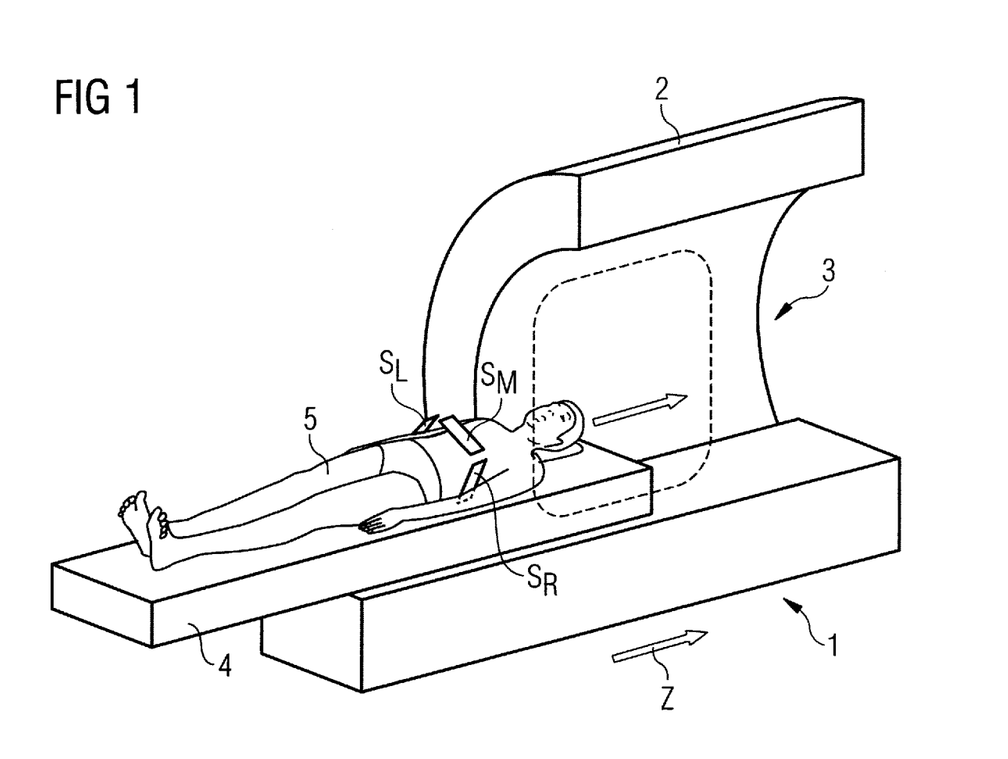
FIG. 1 schematically illustrates a magnetic resonance apparatus.

FIG. 1 shows a magnetic resonance apparatus MRT 1 with a whole-body coil 2 with a tube-shaped or C-shaped space 3 in which a patient bed 4 with, for example, a patient 5 and local coils $S_L$, $S_M$, $S_R$ (each of these local coils can also in turn comprise multiple local coils or local coil channels) can be driven in the direction of the arrow z in order to generate exposures of the patient 5. Here a local coil array 6 (with multiple local coils and channels for signals from the local coils) is placed on the patient, with which local coil array 6 good exposures are enabled in a local region and whose (6) signals can be evaluated (converted into images that can be output etc.) by a known evaluation device that can be connected via coaxial cables etc.

Figure 2:
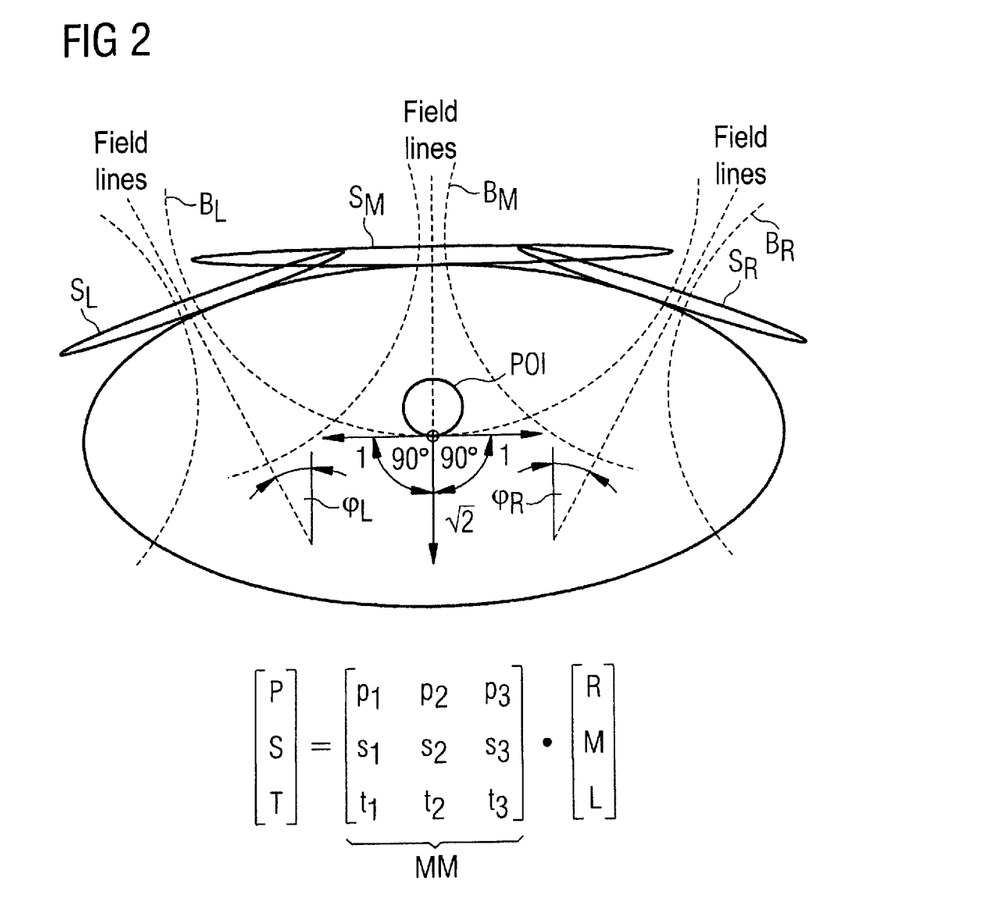
FIG. 2 shows multiple local coils that receive field lines of a magnetic field from a body to be examined from different angles, and a mode matrix to weight signals that have been received with the three field coils.

FIG. 2 shows in cross section the examined upper body of the patient 5, wherein multiple local coils $S_L$, $S_M$, $S_R$ on the patient 5 respectively receive field lines of a magnetic field from the examined body 5 from different angles. The field lines arise via known excitation of atomic nuclei (for example H-nuclei) in a currently examined region of the body 5 via magnetic fields.

The left local coil $S_L$ in FIG. 2 receives, for example, a signal L ($L_1$ or $L_2$) due to field lines $B_L$ that exit from the body 5 at an angle $\phi_L$ relative to the vertical from the region (ROI) in the middle of the body 5 that is to be examined here; the middle local coil $S_M$ in FIG. 2 receives, for example, a signal M due to field lines $B_M$ that exit from the body 5 from the bottom in FIG. 2 toward the top in the direction of the vertical from the region (ROI) in the middle of the body 5 that is to be examined here; and the right local coil $S_R$ in FIG. 2 receives, for example, a signal R due to field lines $B_R$ that exit from the body 5 at an angle $\phi_R$ relative to the vertical from the region (ROI) in the middle of the body 5 that is to be examined here.

The field lines $B_L$ received by the left local coil $S_L$ in FIG. 2 there generate signals L (that can be used to generate an image);

the field lines $B_M$ received by the middle local coil $S_M$ in FIG. 2 there generate signals M (that can be used to generate an image);

the field lines $B_R$ received by the right local coil $S_R$ in FIG. 2 there generate signals R (that can be used to generate an image).

In order to not have to simultaneously calculate too much data in the subsequent image processing by an image computer (far to the right in FIG. 9), signals L, M, R of multiple coils $S_L$, $S_M$, $S_R$ are weighted together, and the data resulting from this is supplied to an image computer.

FIG. 2 shows at the bottom what is known as a mode matrix for weighting signals L, M, R that have been received with the three field coils $S_L$, $S_M$, $S_R$.

The received signals to the right in the equation at the bottom in FIG. 2 are thus multiplied with the three-row, three-column matrix in the middle of the equation in order to obtain the weighted signals P, S, R standing to the left in the equation. The signals P, S, R are thus respectively a combination of the signals R, M, L of the three coils $S_L$, $S_M$, $S_R$ that are weighted with a mode matrix. The factors p2, p3, s1, s2, s3, t1, t2, t3 in the matrix MM at the bottom in FIG. 2 are weighting factors; these weighting factors can, for example, be obtained via a preceding acquisition (prescan) before the acquisition of the actual image, with (for example) lower resolution than in the acquisition of the actual image.

Figure 3:
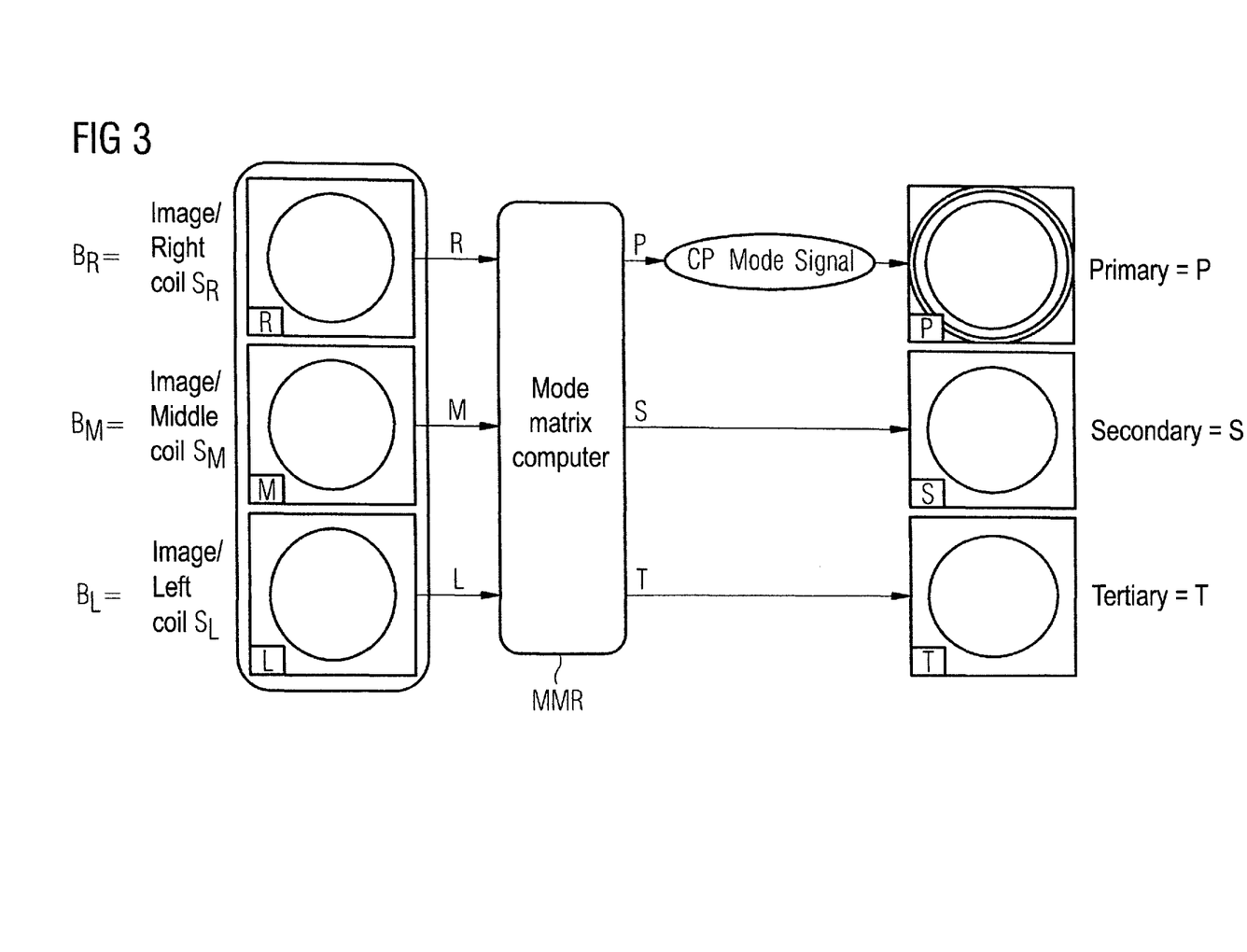
FIG. 3 shows images $B_R$, $B_M$, $B_L$ that have been received with the three field coils and the images after a weighting of the second signals forming the basis of the images BR, BM, BL with a mode matrix.

FIG. 3 shows images $B_R$, $B_M$, $B_L$ that are respectively based on signals R, M, L that have been received with the three field coils, as well as (schematically) a device (mode matrix computer (MMR)) that generates the images P, S, T from signals R, M, L with a mode matrix MM (shown in FIG. 2). As a primary mode image, the image P has the best signal-to-noise ratio in the examined (POI) center of a patient 5; as secondary mode image S and tertiary mode image T, the image S and the image T exhibit the best signal-to-noise ratio in regions lateral to the (POI) center of a patient 5. If necessary, for example, only specific modes (for example only primary modes or modes that best show the region to be examined (SNR etc.) can be taken into account by an image processing computer in order to spare capacity.

Figure 4:
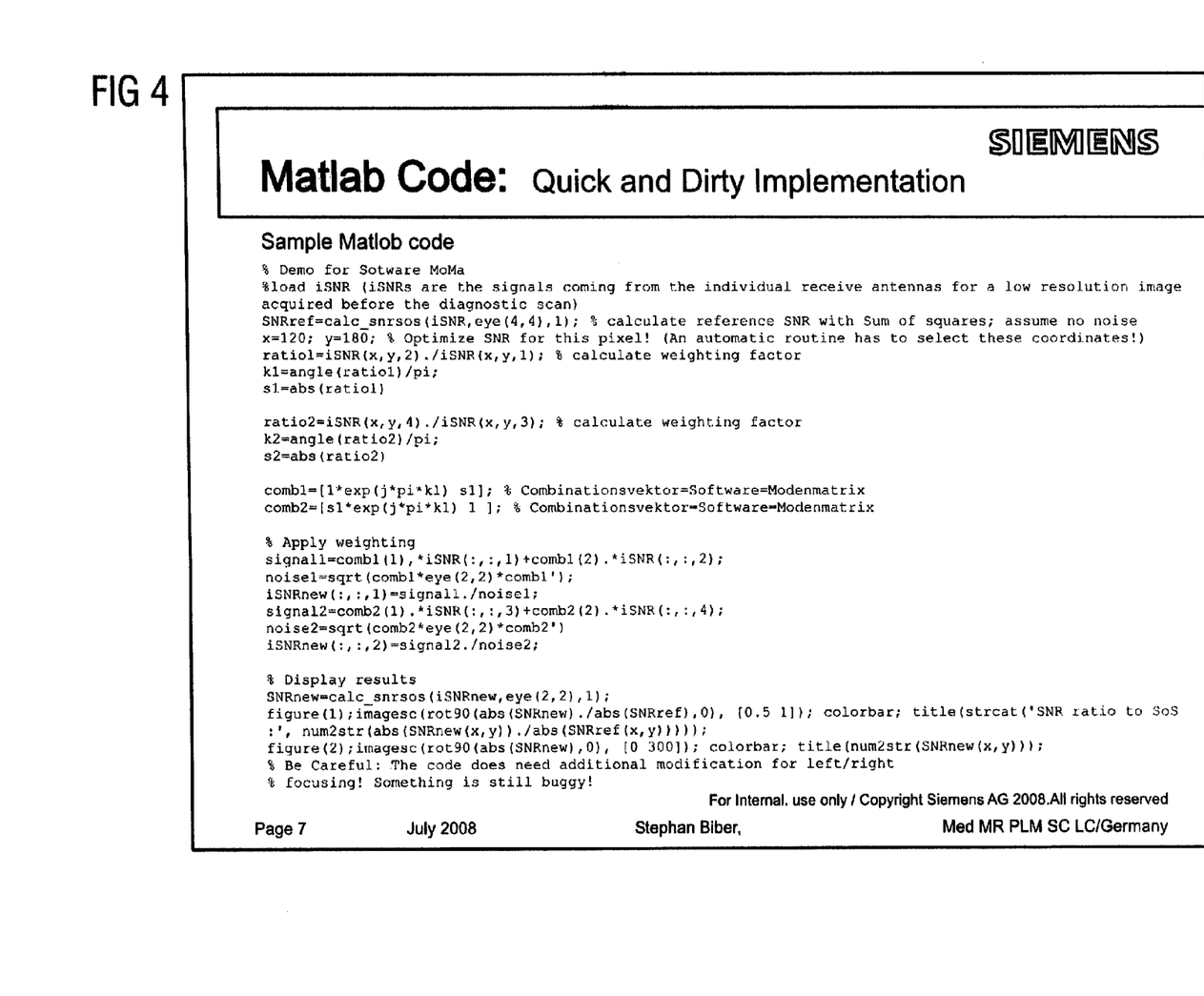
FIG. 4 is a program for implementation of a method according to the invention.

FIG. 4 shows an example a program to implement a method according to the invention.

Figure 5:
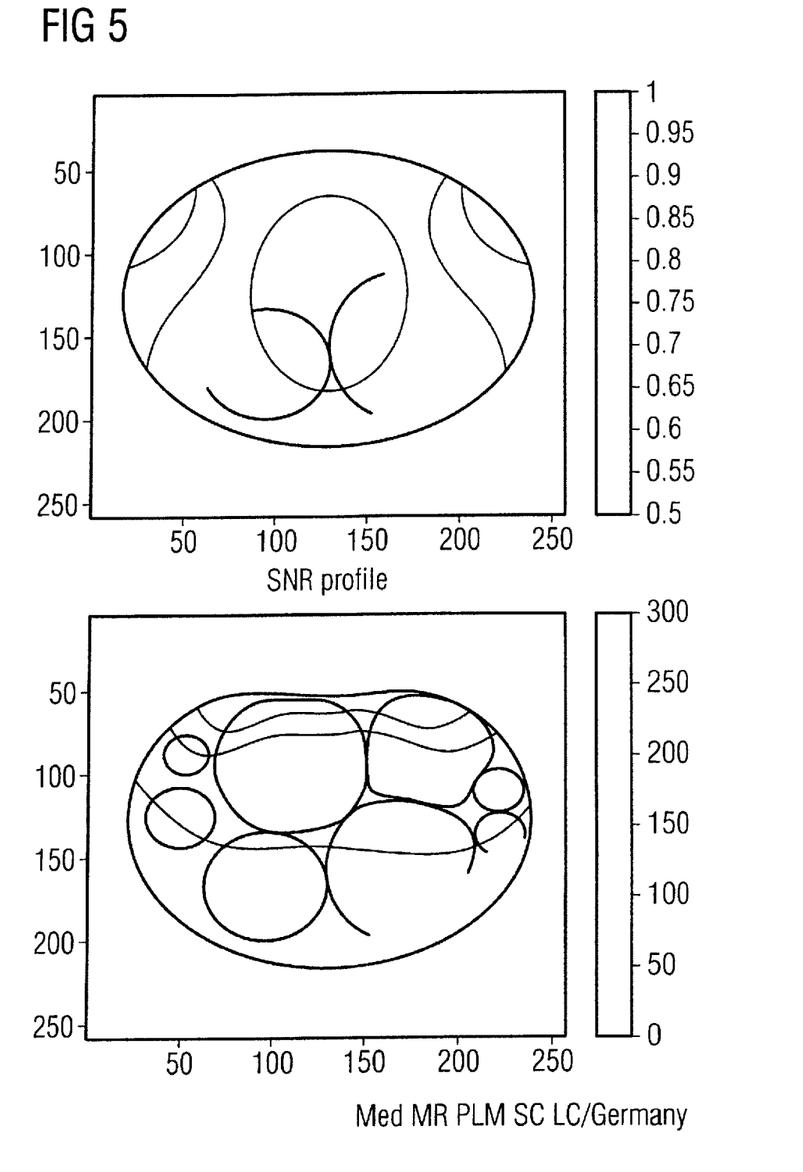
FIG. 5 shows an image regarding the signal-to-noise ratio SNR without weighting and with a weighting (weighting factor abs(ratio)=1.8 and angle(ratio)=131°).

FIG. 5 shows an image regarding signal-to-noise ratio (SNR) without weighting and with weighting (weighting factor abs(ratio)=1.8 and angle(ratio)=131°).

Figure 6:
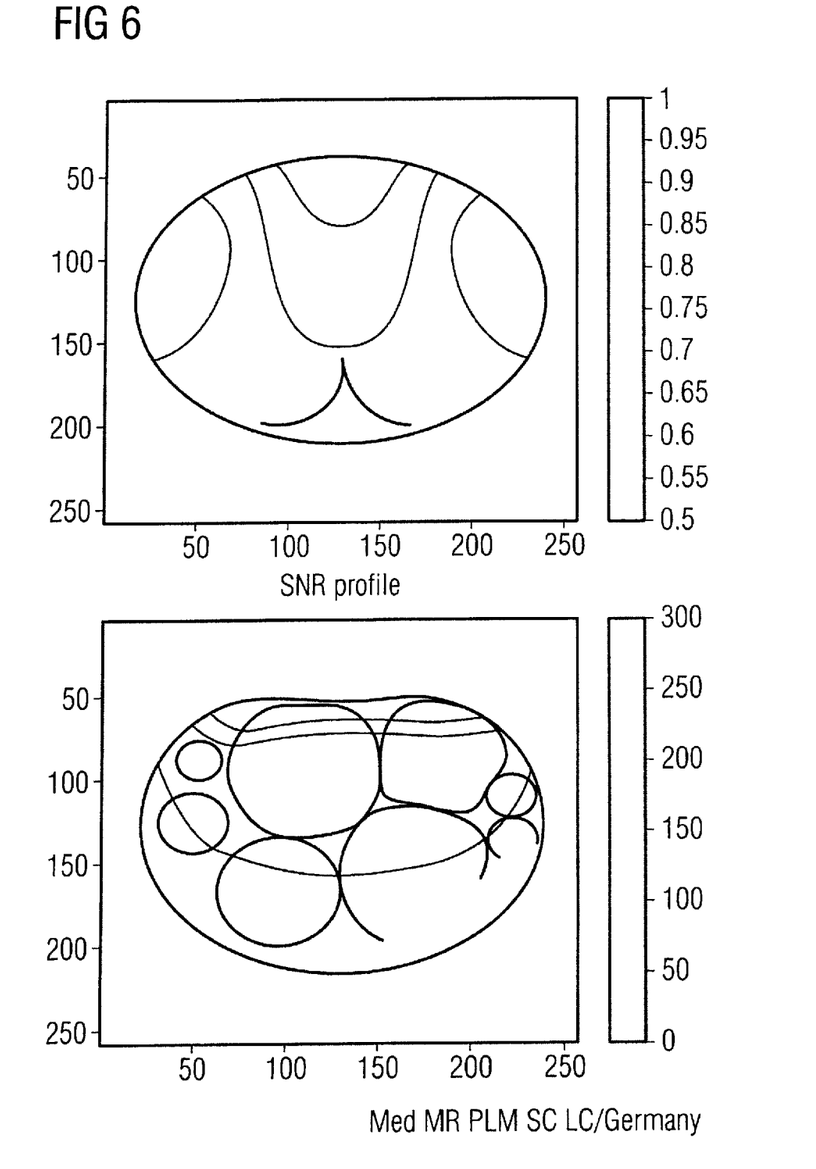
FIG. 6 shows an image regarding signal-to-noise ratio SNR without weighting and with a weighting (weighting factor abs(ratio)=12 and angle(ratio)=75°).
Figure 7:
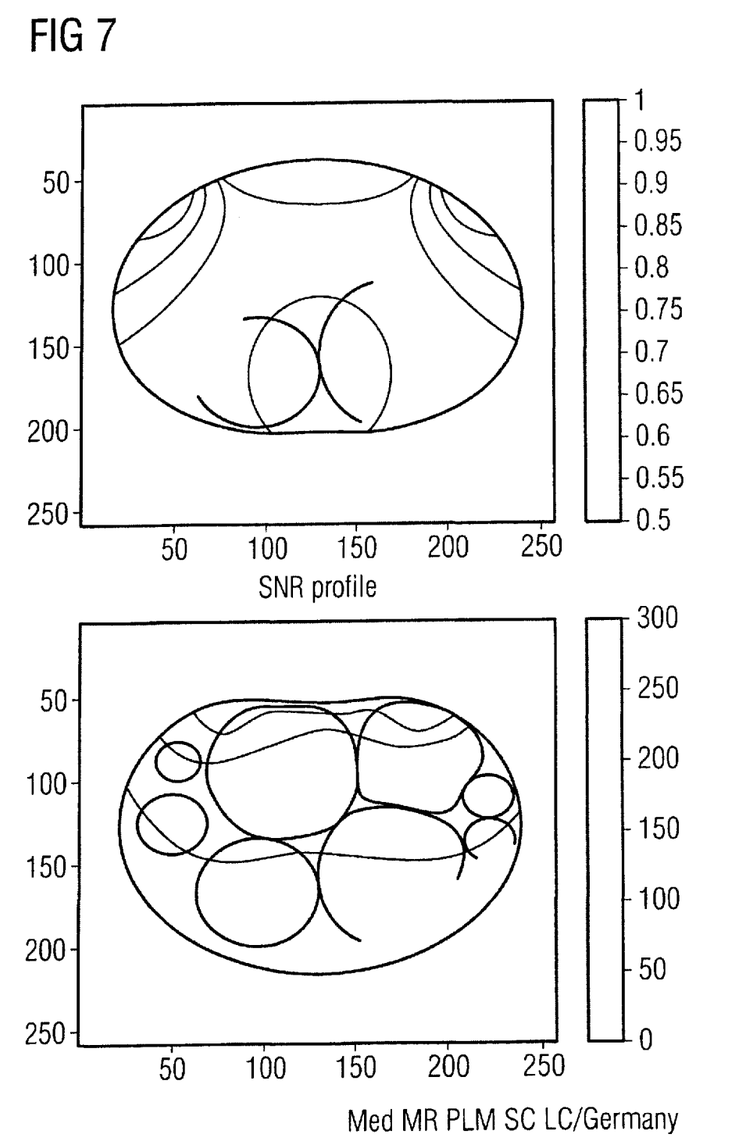
FIG. 7 shows an image regarding the signal-to-noise ratio SNR without weighting and with a weighting (weighting factor abs(ratio)=1.3 and angle(ratio)=140°).
Figure 8:
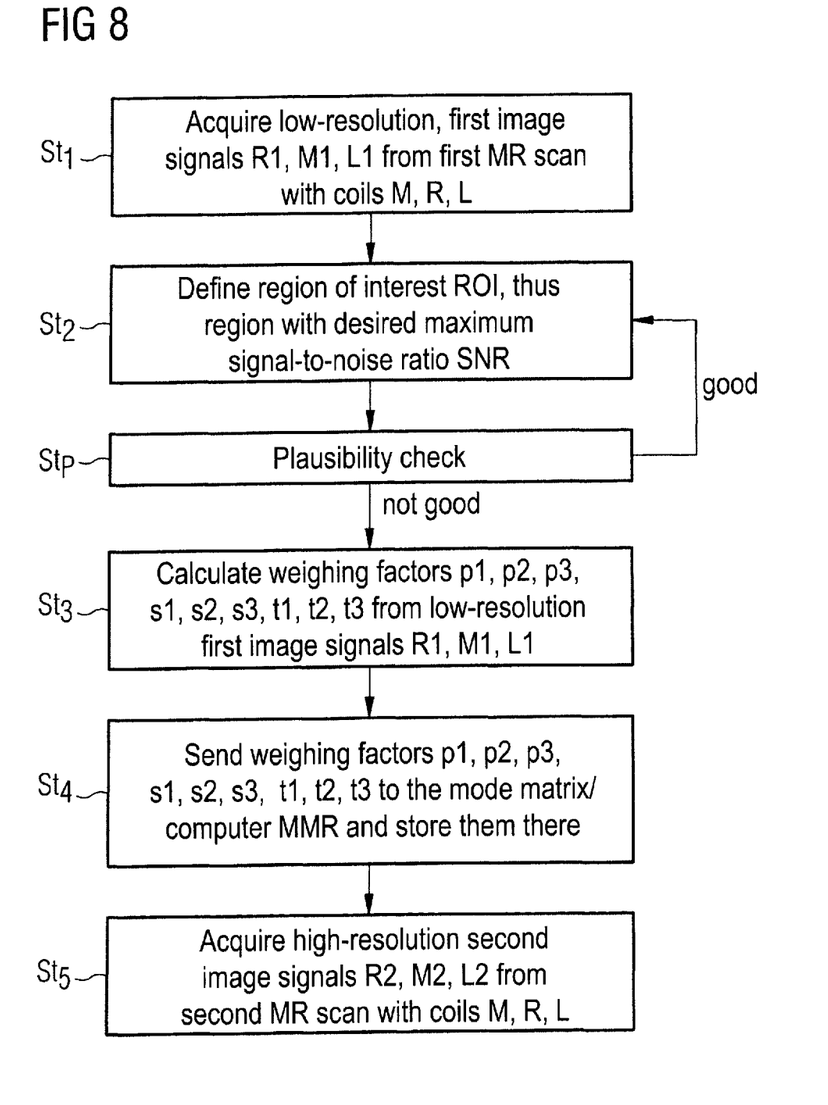
FIG. 8 a flowchart of an embodiment of a method according to the invention.

FIG. 6 shows an image for signal-to-noise ratio SNR without weighting and with weighting (weighting factor abs(ratio)=12 and angle(ratio)=75°), FIG. 7 shows an image regarding the signal-to-noise ratio SNR without weighting and with weighting (weighting factor abs(ratio)=1.3 and angle(ratio)=140°), FIG. 8 shows a flowchart for an implementation of a method according to the invention.

In Step $St_1$, low-resolution (compared to the image acquired later) first image signals R1, M1, L1 are acquired with coils M, R, L as a first exposure (MR scan) with the magnetic resonance apparatus MRT.

In Step $St_2$, a region of interest ROI of the body 5 that should be shown well in an image (thus a region with desired maximum signal-to-noise ratio SNR etc.) is defined (via input or automatically).

In Step $St_3$, a plausibility check is conducted as to whether this region ROI was a plausible selection; in the event that the selection was not good, the previous step is possibly repeated.

In Step $St_4$, weighting factors p1, p2, p3, s1, s2, s3, t1, t2, t3 are calculated from low-resolution first image signals R1, M1, L1.

In Step $St_5$, these weighting factors p1, p2, p3, s1, s2, s3, t1, t2, t3 are sent to the mode matrix computer MMR and stored there.

In Step $St_7$, higher-resolution (than in the first image in $St_1$) second image signals R1, M1, L1 are acquired from a second MR scan with the coils M, R, L.

Figure 9:
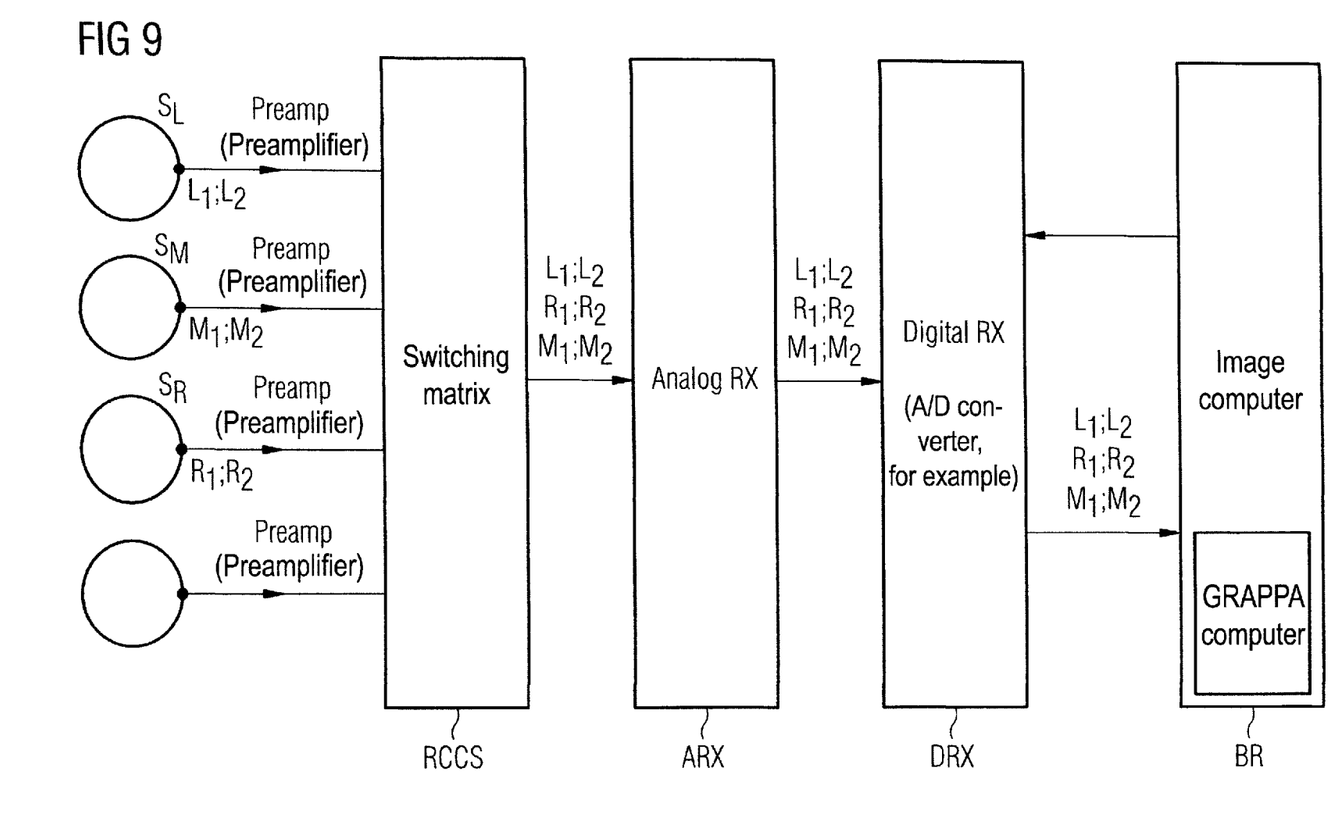
FIG. 9 is a block diagram of an embodiment of a device according to the invention.

FIG. 9 shows a block diagram for implementation of a device according to the invention.

Signals are received by coils $S_L$, $S_M$, $S_R$ that are respectively amplified with a preamplifier Preamp and are supplied to the RCS.

A switching matrix can be arranged in the element RCS, which switching matrix selects the signals of specific coils (here coils $S_L$, $S_M$, $S_R$) from image signals R, M, L amplified with preamplifiers preamp and relays them while the signals of other coils (such as the lowermost coil in FIG. 9) are not currently considered (thus are already separated out before the weighting with the mode matrix). A switching matrix RCCS routes the currently active receiver channels or the receiver channels of interest of the coils $S_L$, $S_M$, $S_R$ to the receivers, which are schematically represented together by the element "Analog RX".

From the receivers (Analog RX (ARX)), the possibly amplified signals are sent to the analog-digital converter (DRX) and, digitized, are sent from there to an image computer BR that generates images to be displayed to the user of the MRT from the image signals acquired with the coils.

A computer that can weight image data with the mode matrix MM can, for example, be arranged in the image computer BR or in the element DRX.

If the computer that weights image data with the mode matrix MM is arranged in the image computer BR, the data R, M, L are transferred as shown from DRX to the image computer. If the computer that weights image data with the mode matrix MM is arranged in the element DRX, instead of this data R2, M2, L2 weighted with the mode matrix are transferred from DRX to the image computer.

Figure 10:
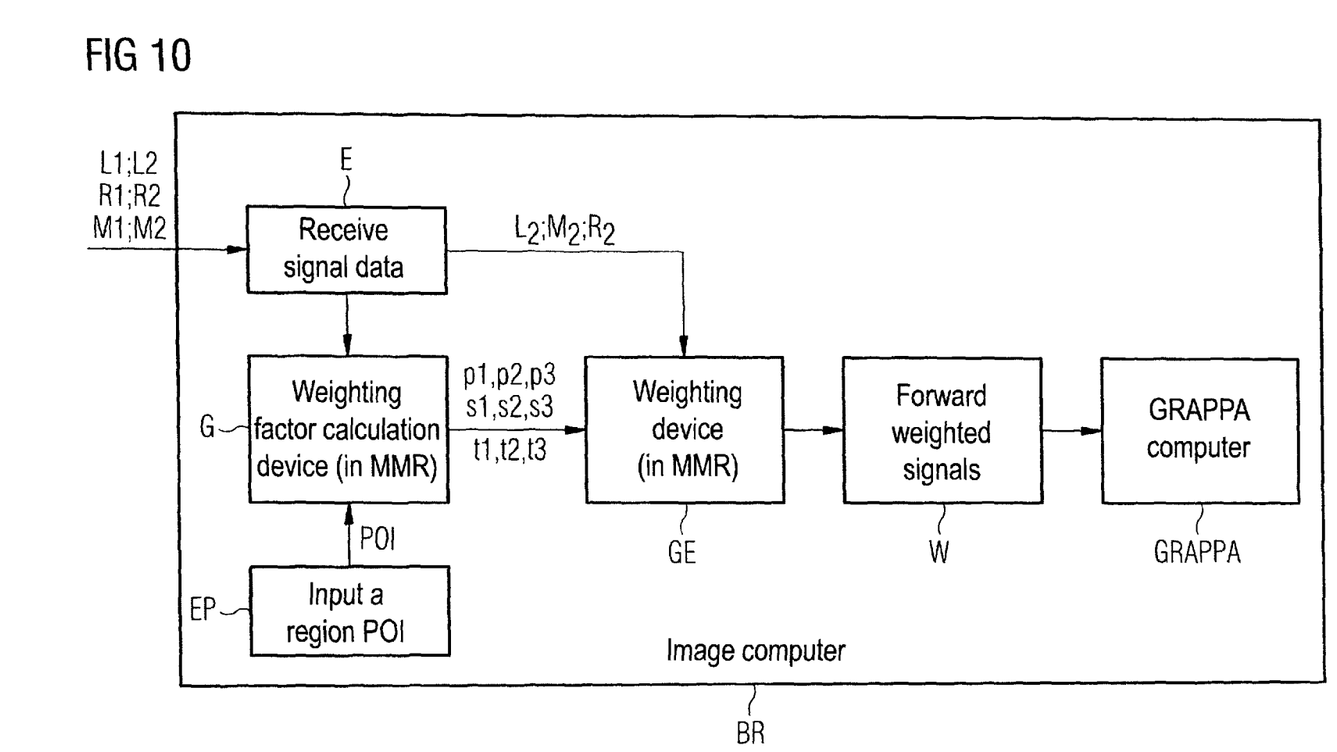
FIG. 10 is a block diagram of an image computer of the device according to the invention.

FIG. 10 schematically shows as a block diagram an image computer BR with a receiver device in the form of, for example, an interface E to receive first signals $R_1$, $M_1$, $L_1$ and second signals $R_2$, $M_2$, $L_2$, with a device EP in order to define a region in the body (that should be very visible in the images compared with other regions), with a weighting factor calculation device GBE in order to calculate weighting factors p1, p2, p3, s1, s2, s3, t1, t2, t3 with the aid of the first signals $R_1$, $M_1$, $L_1$, with a weighting device GE in order to weight (MMR) the two signals $R_2$, $M_2$, $L_2$ with the aid of the weighting factors p1, p2, p3, s1, s2, s3, t1, t2, t3, thus in order to obtain weighted signals P, S, T, with a device W in order to provide the weighted signals P, S, T to a computer GRAPPA etc. for further processing.

The weighted signal combination (that has previously occurred in a specific hardware mode matrix) also can be implemented in an image computer BR (for example with software) or another system for digital signal processing. Since, after the transfer of the reception signals over the entire reception chain (=RX chain, for example with preamplifier, mixer, cable, plug, analog RX, digital RX), the phase relationships of the adjacent signals are not known, intelligent methods can be provided to determine the complex signal weighting coefficients that are used in the signal addition. (The transmission phase is not known since it would be an enormous effort to characterize the entire RX chain with regard to its phase transmission properties.) Since parallel imaging methods place very high demands on the computing power and the memory requirement of the image reconstruction, a mode matrix in the image computer (for example as software there) can contribute significantly to the savings of costs and/or computer time (for example, in GRAPPA the memory requirement rises more than quadratically with the number of channels).

The method include the following sub-Steps:

1. acquisition of low-resolution MR image data (for example 10×10 or 50×50 matrix, for example in a prescan measurement or an adjustment measurement or from central k-space lines necessary for parallel imaging), 2. automatic algorithm for the selection of an advantageous point for the determination of the weighting coefficients and plausibility check 3. generation of the weighting factors 4. application of the weighting factors to the digitized image data to reduce the channel count before feeding the data into the image reconstruction chain regarding 1.:

Since the weighting coefficients must be generated from image data, it is appropriate to already acquire image data before the actual diagnostic measurement. In order to save measurement time, the use of low-resolution data is suggested since these are sufficient. These data can be obtained from a low-resolution MR image or from other data that are obtained for parallel imaging, for example (central k-space lines). How many coil elements (loops) are in parallel and which of these should later be combined with one another can possibly likewise be derived from these measurements.

regarding 2.:

If the channel reduction algorithm should be kept as simple as possible, the optimal signal-to-noise ratio can be generated only at one point (preferably in the center of the patient). The point at which no SNR loss should occur even after the channel reduction can be obtained in various ways. The user manually selects an ROI (region of interest) for which the SNR should be optimized in a menu on the control panel. (Disadvantage: the user must be involved. Advantage: the user can place the ROI arbitrarily.) The ROI is automatically placed in the center of the body; the center of the body is determined by an image recognition algorithm that, for example, uses low-resolution data obtained under 1.; for example, the center point of the body could be obtained via center of gravity calculation from the body contours.

In order to check whether the ROI was not coincidentally selected in a region from which little signal was received (for example in the lung), an algorithm checks the plausibility of the ROI selection. This can occur by testing the signal amplitude or of the SNR in the ROI (signal should be strong enough!) or testing the signal of the neighboring points (ensure that a point or an ROI at the edge of a low-signal region was not selected).

regarding 3.:

The weighting factors are derived by calculating the ratio of the signals that are to be combined.

For this purpose, the signals of the individual loop antennas from the ROI defined under 2. are used in order to produce the maximum signal-to-noise in this ROI even after the channel combination.

regarding 4.:

The weighting factors are provided to a function that combines the incoming signal data after the digitization (for example in the image computer or at the digital receiver) during the actual measurement.

The combination ensues as a summation weighted with the complex signal (amplitude and phase!) weighting factors.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to evaluate magnetic resonance signals comprising the steps of:
    generating first signals by interaction of detection coils in a magnetic resonance tomography apparatus with magnetic fields emanating from a defined region of a subject in the magnetic resonance tomography apparatus;
    supplying said first signals to a processor and, in said processor, automatically calculating weighting factors exclusively from said first signals by determining, from said first signals, a sub-region within said region that is best visible in a resulting magnetic resonance image, and calculating said weighting factors with respect to said sub-region;
    generating second signals with said coils by interaction of the detection coils with magnetic fields emanating from the region of the subject;
    supplying said second signals to said processor and, in said processor, automatically calculating weighted signals by weighting only said second signals with said weighting factors; and
    making said weighted signals available at an output of said processor.

2. A method as claimed in claim 1 comprising generating said second signals with a higher resolution than said first signals.

3. A method as claimed in claim 1 comprising generating said first signals with a magnetic resonance data acquisition technique that generates a tomographic image of the region of the subject with fewer than 50×50 pixels.

4. A method as claimed in claim 1 comprising generating said first signals with a magnetic resonance data acquisition technique that generates a tomographic image of the region of the subject with fewer than 10×10 pixels.

5. A method as claimed in claim 1 comprising generating said first signals in a pre-scan data acquisition implemented before a diagnostic data acquisition.

6. A method as claimed in claim 1 comprising generating said first signals by acquiring magnetic resonance data from the region of the subject and entering said magnetic resonance data into a plurality of lines of k-space, and using entries in non-central lines of k-space as said first signals.

7. A method as claimed in claim 1 wherein each of said first signals has a magnitude, and calculating said weighting factors with an amplitude and phase dependent on the respective magnitudes of the first signals.

8. A method as claimed in claim 1 comprising calculating said weighting factors with respect to the center of gravity of said region.

9. A method as claimed in claim 1 comprising digitizing said second signals, and weighting said second signals with said weighting factors, to obtain said weighted signals, before digitizing said second signals.

10. A method as claimed in claim 1 comprising digitizing said second signals, and weighting said second signals with said weighting factors, to obtain said weighted signals, after digitizing said second signals.

11. A method as claimed in claim 1 wherein said first signals are first analog signals and wherein said second signals are second analog signals, and comprising operating on each of said first and second analog signals in said processor to calculate said weighting factors and to generate said weighted signals.

12. A method to evaluate magnetic resonance signals, comprising:
    generating first signals by interaction of detection coils in a magnetic resonance tomography apparatus with magnetic fields emanating from a defined region of a subject in the magnetic resonance tomography apparatus;
    supplying said first signals to a processor and, in said processor, automatically calculating weighting factors exclusively from said first signals by determining, from said first signals, a point in said defined region exhibiting a lowest signal-to-noise ratio and calculating said weighting factors relative to said point;

generating second signals with said coils by interaction of the detection coils with magnetic fields emanating from the region of the subject;

supplying said second signals to said processor and, in said processor, automatically calculating weighted signals by weighting only said second signals with said weighting factors; and making said weighted signals available at an output of said processor.

13. A method to evaluate magnetic resonance signals, comprising:

generating first signals by interaction of detection coils in a magnetic resonance tomography apparatus with magnetic fields emanating from a defined region of a subject in the magnetic resonance tomography apparatus;

supplying said first signals to a processor and, in said processor, automatically calculating weighting factors exclusively from said first signals by iteratively evaluating respective points in said region, represented by said first signals, with respect to a characteristic embodied in said first signals, and calculating said weighting factors with respect to a point at which said characteristic is best for generating a resulting magnetic resonance image from said weighted signals;

generating second signals with said coils by interaction of the detection coils with magnetic fields emanating from the region of the subject;

supplying said second signals to said processor and, in said processor, automatically calculating weighted signals by weighting only said second signals with said weighting factors; and making said weighted signals available at an output of said processor.

14. A method to evaluate magnetic resonance signals, comprising:

generating first analog signals by interaction of detection coils in a magnetic resonance tomography apparatus with magnetic fields emanating from a defined region of a subject in the magnetic resonance tomography apparatus;

supplying said first analog signals to a processor and, in said processor, automatically calculating weighting factors exclusively from said first analog signals by digitizing said first analog signals in said processor to obtain first digital signals, and calculating said weighting factors digitally exclusively from said first digital signals;

generating second analog signals with said coils by interaction of the detection coils with magnetic fields emanating from the region of the subject;

supplying said second analog signals to said processor and, in said processor, automatically digitizing said second analog signals to generate second digital signals, and digitally weighting only said digital second signals with said digital weighting factors, to obtain digital weighted signals; and making said digital weighted signals available at an output of said processor.

15. A device to evaluate magnetic resonance signals comprising:

an operating unit configured to operate a magnetic resonance tomography apparatus to generate first signals by interaction of detection coils of the magnetic resonance tomography apparatus with magnetic fields emanating from a defined region of a subject in the magnetic resonance tomography apparatus;

a processor supplied with said first signals, said processor being configured to automatically calculate weighting factors exclusively from said first signals by determining, from said first signals, a sub-region within said region that is best visible in a resulting magnetic resonance image, and calculating said weighting factors with respect to said sub-region;

said operating unit being configured to operate said magnetic resonance tomography apparatus to generate second signals with said detection coils by interaction of the detection coils with magnetic fields emanating from the region of the subject;

said processor being supplied with said second signals and being configured to automatically calculate weighted signals by weighting only said second signals with said weighting factors; and said processor being configured to make said weighted signals available at an output of said processor.

16. A device as claimed in claim 15 wherein each of said first signals has a magnitude, and wherein said processor is configured to calculate said weighting factors with an amplitude and phase dependent on the respective magnitudes of the first signals.

17. A device as claimed in claim 15 wherein said processor is configured to calculate said weighting factors with respect to the center of gravity of said region.

18. A device as claimed in claim 15 wherein said processor is configured to digitize said second signals, and weighting said second signals with said weighting factors, to obtain said weighted signals, before digitizing said second signals.

19. A device as claimed in claim 15 wherein said processor is configured to digitize said second signals, and weighting said second signals with said weighting factors, to obtain said weighted signals, after digitizing said second signals.

20. A device as claimed in claim 15 wherein said first signals are first analog signals and wherein said second signals are second analog signals, and wherein said processor is configured to operate on each of said first and second analog signals to calculate said weighting factors and to generate said weighted signals.

21. A device to evaluate magnetic resonance signals, comprising:

an operating unit configured to operate a magnetic resonance tomography apparatus to generate first signals by interaction of detection coils of the magnetic resonance tomography apparatus with magnetic fields emanating from a defined region of a subject in the magnetic resonance tomography apparatus;

a processor supplied with said first signals, said processor being configured to automatically calculate weighting factors exclusively from said first signals, by automatically determining, from said first signals, a point in said defined region exhibiting a lowest signal-to-noise ratio and calculating said weighting factors relative to said point;

said operating unit being configured to operate said magnetic resonance tomography apparatus to generate second signals with said detection coils by interaction of the detection coils with magnetic fields emanating from the region of the subject;

said processor being supplied with said second signals and being configured to automatically calculate weighted signals by weighting only said second signals with said weighting factors; and said processor being configured to make said weighted signals available at an output of said processor.

22. A device to evaluate magnetic resonance signals, comprising:
- an operating unit configured to operate a magnetic resonance tomography apparatus to generate first signals by interaction of detection coils of the magnetic resonance tomography apparatus with magnetic fields emanating from a defined region of a subject in the magnetic resonance tomography apparatus;
- a processor supplied with said first signals, said processor being configured to automatically calculate weighting factors exclusively from said first signals by iteratively evaluating respective points in said region, represented by said first signals, with respect to a characteristic embodied in said first signals, and calculating said weighting factors with respect to a point at which said characteristic is best for generating a resulting magnetic resonance image from said weighted signals;
- said operating unit being configured to operate said magnetic resonance tomography apparatus to generate second signals with said detection coils by interaction of the detection coils with magnetic fields emanating from the region of the subject;
- said processor being supplied with said second signals and being configured to automatically calculate weighted signals by weighting only said second signals with said weighting factors; and
- said processor being configured to make said weighted signals available at an output of said processor.

23. A device to evaluate magnetic resonance signals, comprising:
- an operating unit configured to operate a magnetic resonance tomography apparatus to generate first analog signals by interaction of detection coils of the magnetic resonance tomography apparatus with magnetic fields emanating from a defined region of a subject in the magnetic resonance tomography apparatus;
- a processor supplied with said first analog signals, said processor being configured to digitize said first analog signals to obtain first digital signals and to calculate weighting factors digitally exclusively from said first digital signals;
- said operating unit being configured to operate said magnetic resonance tomography apparatus to generate second analog signals with said detection coils by interaction of the detection coils with magnetic fields emanating from the region of the subject;
- said processor being supplied with said second analog signals and being configured to digitize said second analog signals to generate second digital signals, and to digitally weight only said digital second signals with said digital weighting factors, to obtain digital weighted signals; and
- said processor being configured to make said weighted signals available at an output of said processor.

24. A magnetic resonance tomography apparatus comprising:
- a magnetic resonance data acquisition unit comprising detection coils;
- an operating unit configured to operate said detection coils in said magnetic resonance data acquisition unit to generate first signals by interaction of the detection coils with magnetic fields emanating from a defined region of a subject in the magnetic resonance data acquisition unit;
- a processor supplied with said first signals and configured to automatically calculate weighting factors exclusively from said first signals by determining, from said first signals, a sub-region within said region that is best visible in a resulting magnetic resonance image, and calculating said weighting factors with respect to said sub-region;
- said operating unit being configured to operate said magnetic resonance data acquisition unit to generate second signals with said coils by interaction of the coils with magnetic fields emanating from the region of the subject;
- said second signals being supplied to said processor and said processor being configured to automatically calculate weighted signals by weighting only said second signals with said weighting factors; and
- said processor being configured to make said weighted signals available at an output of said processor.

25. An apparatus as claimed in claim 24 wherein said operating unit is configured to operate said magnetic resonance data acquisition unit to generate said second signals with a higher resolution than said first signals.

26. An apparatus as claimed in claim 24 wherein said operating unit is configured to operate said magnetic resonance data acquisition unit to generate said first signals with a magnetic resonance data acquisition technique that generates a tomographic image of the region of the subject with fewer than 50×50 pixels.

27. An apparatus as claimed in claim 24 wherein said operating unit is configured to operate said magnetic resonance data acquisition unit to generate said first signals with a magnetic resonance data acquisition technique configured to generate a tomographic image of the region of the subject with fewer than 10×10 pixels.

28. An apparatus as claimed in claim 24 wherein said operating unit is configured to operate said magnetic resonance data acquisition unit to generate said first signals in a pre-scan data acquisition implemented before a diagnostic data acquisition.

29. An apparatus as claimed in claim 24 wherein said operating unit is configured to operate said magnetic resonance data acquisition unit to generate said first signals by acquiring magnetic resonance data from the region of the subject and entering said magnetic resonance data into a plurality of lines of k-space, and using entries in non-central lines of k-space as said first signals.

30. A magnetic resonance tomography apparatus comprising:
- a magnetic resonance data acquisition unit comprising detection coils;
- an operating unit configured to operate said magnetic resonance data acquisition unit to generate first signals by interaction said detection coils with magnetic fields emanating from a defined region of a subject in the magnetic resonance data acquisition unit;
- a processor supplied with said first signals, said processor being configured to automatically calculate weighting factors exclusively from said first signals, by automatically determining, from said first signals, a point in said defined region exhibiting a lowest signal-to-noise ratio and calculating said weighting factors relative to said point;
- said operating unit being configured to operate said magnetic resonance data acquisition unit to generate second signals with said detection coils by interaction of the detection coils with magnetic fields emanating from the region of the subject;

said processor being supplied with said second signals and being configured to automatically calculate weighted signals by weighting only said second signals with said weighting factors; and said processor being configured to make said weighted signals available at an output of said processor.

31. A magnetic resonance tomography apparatus comprising:

a magnetic resonance data acquisition unit comprising detection coils;

an operating unit configured to operate said magnetic resonance data acquisition unit to generate first signals by interaction of said detection coils with magnetic fields emanating from a defined region of a subject in the magnetic resonance data acquisition unit;

a processor supplied with said first signals, said processor being configured to automatically calculate weighting factors exclusively from said first signals by iteratively evaluating respective points in said region, represented by said first signals, with respect to a characteristic embodied in said first signals, and calculating said weighting factors with respect to a point at which said characteristic is best for generating a resulting magnetic resonance image from said weighted signals;

said operating unit being configured to operate said magnetic resonance data acquisition unit to generate second signals with said detection coils by interaction of the detection coils with magnetic fields emanating from the region of the subject;

said processor being supplied with said second signals and being configured to automatically calculate weighted signals by weighting only said second signals with said weighting factors; and said processor being configured to make said weighted signals available at an output of said processor.

32. A magnetic resonance tomography apparatus comprising:

a magnetic resonance data acquisition unit comprising detection coils;

an operating unit configured to operate said magnetic resonance data acquisition unit to generate first analog signals by interaction of said detection coils with magnetic fields emanating from a defined region of a subject in the magnetic resonance data acquisition unit;

a processor supplied with said first analog signals, said processor being configured to digitize said first analog signals to obtain first digital signals and to calculate weighting factors digitally exclusively from said first digital signals;

said operating unit being configured to operate said magnetic resonance data acquisition unit to generate second analog signals with said detection coils by interaction of the detection coils with magnetic fields emanating from the region of the subject;

said processor being supplied with said second analog signals and being configured to digitize said second analog signals to generate second digital signals, and to digitally weight only said digital second signals with said digital weighting factors, to obtain digital weighted signals; and said processor being configured to make said weighted signals available at an output of said processor.

* * * * *